(12) United States Patent
Ma et al.

(10) Patent No.: US 6,403,896 B1
(45) Date of Patent: Jun. 11, 2002

(54) SUBSTRATE HAVING SPECIFIC PAD DISTRIBUTION

(75) Inventors: Shu Jung Ma; Chi Tsung Chiu; Chang Chi Lee, all of Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/670,352

(22) Filed: Sep. 27, 2000

(51) Int. Cl.⁷ .................... H05K 1/11; H01R 12/04
(52) U.S. Cl. ........................... 174/261; 361/777
(58) Field of Search .................. 174/261, 262–267; 361/772–780

(56) References Cited

U.S. PATENT DOCUMENTS

| | | | | |
|---|---|---|---|---|
| 5,598,036 A | * | 1/1997 | Ho | 257/738 |
| 5,640,047 A | * | 6/1997 | Nakashima | 257/738 |
| 5,703,402 A | * | 12/1997 | Chu et al. | 257/737 |
| 5,894,410 A | | 4/1999 | Barrow | |
| 6,057,596 A | | 5/2000 | Lin et al. | |
| 6,137,168 A | * | 10/2000 | Kirkman | 257/691 |
| 6,163,071 A | * | 12/2000 | Yamamura | 257/691 |
| 6,201,302 B1 | * | 3/2001 | Tzu | 257/724 |
| 6,242,815 B1 | * | 6/2001 | Hsu et al. | 257/786 |

* cited by examiner

Primary Examiner—Cuneo Kamand
Assistant Examiner—Jeremy Norris
(74) Attorney, Agent, or Firm—Stevens, Davis, Miller & Mosher, LLP

(57) ABSTRACT

A substrate for use in packaging of a semiconductor chip having opposing upper and lower surfaces has a lower surface which comprises an outer array of contact pads, a center array of contact pads and a plurality of intermediate pads located between the outer array of contact pads and the center array of contact pads. All of the intermediate pads are electrically connected to the ground ring.

10 Claims, 3 Drawing Sheets

SUBSTRATE HAVING SPECIFIC PAD DISTRIBUTION

BACKGROUND OF THE INVENTION

1. Field of the Invention

This invention relates to a substrate, and more particularly to a substrate for use in forming a ball grid array (BGA) package.

2. Description of the Related Art

As electronic devices have become more smaller and thinner, the velocity and the complexity of IC chip become more and more higher. Accordingly, a need has arisen for higher package efficiency. To meet the need, the ball grid array (BGA) technology has been developed by the semiconductor industry.

FIG. 1 is a cross sectional view of a typical BGA package 100 according to a preferred embodiment disclosed in U.S. Pat. No. 5,894,410. A semiconductor chip 101 is attached to a die covering area on an upper surface (die attach surface) 102a of a substrate 102 with adhesive. Bonding pads (not shown) on the chip 101 are connected with electrically conductive bond wires 103 to a ground ring 102b, a power ring 102c, and conductive traces 102d formed on the upper surface 102a of the substrate 102. Electrically conductive vias (not shown) are formed through the substrate 102 from the ground ring 102b, power ring 102c, or traces 102d on the upper surface 102a to a lower surface (mounting surface) 102e of the substrate 102 opposite the upper surface 102a. The lower surface 102e of the substrate 102 is provided with a plurality of solder pads 102f electrically connected to the ground ring 102b, power ring 102c, or corresponding traces 102d, respectively. Each solder pad 102f is provided with a solder ball 110 for making external electrical connection. The solder balls 110 include power balls for supplying the source voltage, ground balls for supplying the ground potential and signal balls. The ground ring 102b, power ring 102c, conductive traces 116 and solder pads 118 are usually made of metal with good electrical conductivity such as copper. The chip 101 and a portion of the upper surface 102a of the substrate 102 are encapsulated in a package body 120. Finally, the solder balls 110 are reflowed to attach the package 100 to a mounting board (not shown).

FIG. 2 is a bottom view of the package 100 of FIG. 1. The solder balls 110 of the package 100 are divided into an outer array and a center array. Typically, the semiconductor chip 101 is formed of microcrystalline silicon with a coefficient of thermal expansion (CTE) of 3–5 ppm° C.$^{-1}$ and the substrate 102 is usually formed of polymer having a coefficient of thermal expansion of 20–30 ppm° C.$^{-1}$. Since there is a significant difference between the semiconductor chip 101 and the substrate 102 in CTE, the semiconductor chip 101 and the substrate 102 expand and contract in different amounts along with temperature fluctuations. It has been found that, the differential thermal expansion between the semiconductor chip 101 and the substrate 102 will significantly increase the chances of failing solder joints in an area which corresponds to the periphery of the semiconductor chip 101. Therefore, it is desired to locate the solder balls 110 away from the periphery of the semiconductor chip 101 thereby reducing solder failure.

However, during manufacturing processes with rapid temperature increases such as IR reflow, the solder joints close to the periphery of the semiconductor chip 101 are still prone to fail.

The present invention therefore seeks to provide a BGA package which overcomes, or at least reduces the above-mentioned problems of the prior art.

SUMMARY OF THE INVENTION

It is a primary object of the present invention to provide a BGA package having a substrate with a specific contact pad distribution to enhance solder joint reliability.

The BGA package of the present invention mainly comprises a substrate and a semiconductor chip mounted thereon. The upper surface of the substrate comprises a ground ring. The substrate is characterized in that the lower surface thereof comprises an outer array of contact pads, a center array of contact pads and a plurality of intermediate pads located between the outer array of contact pads and the center array of contact pads, wherein all of the intermediate pads are electrically connected to the ground ring. A plurality of solder balls are attached to the pads of the substrate. The solder balls are typically reflowed to attach the package to a mounting board such as a printed circuit board. The semiconductor chip is electrically coupled to the solder balls by internal routing within the package.

Since the intermediate pads are designed for supplying ground potential, solder failure of some balls attached thereon is not critical. Therefore, the solder balls attached to the intermediate pads helps to absorb stress without sacrificing the reliability of the BGA package.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
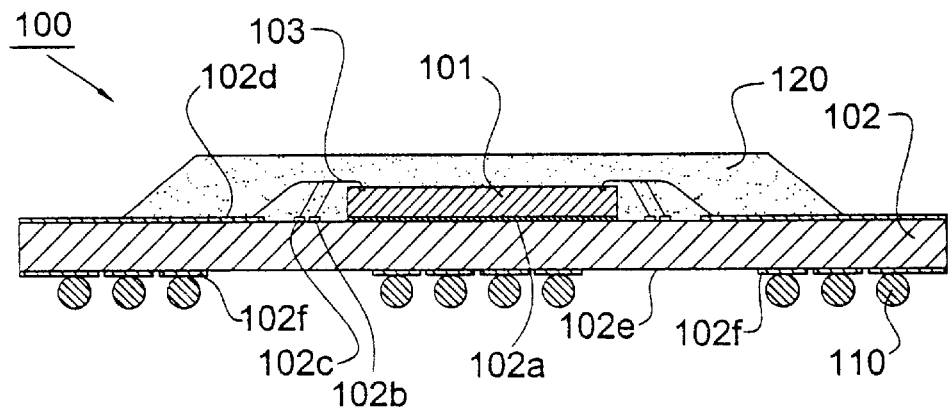
FIG. 1 is a cross-sectional view of a typical BGA package.
Figure 2:
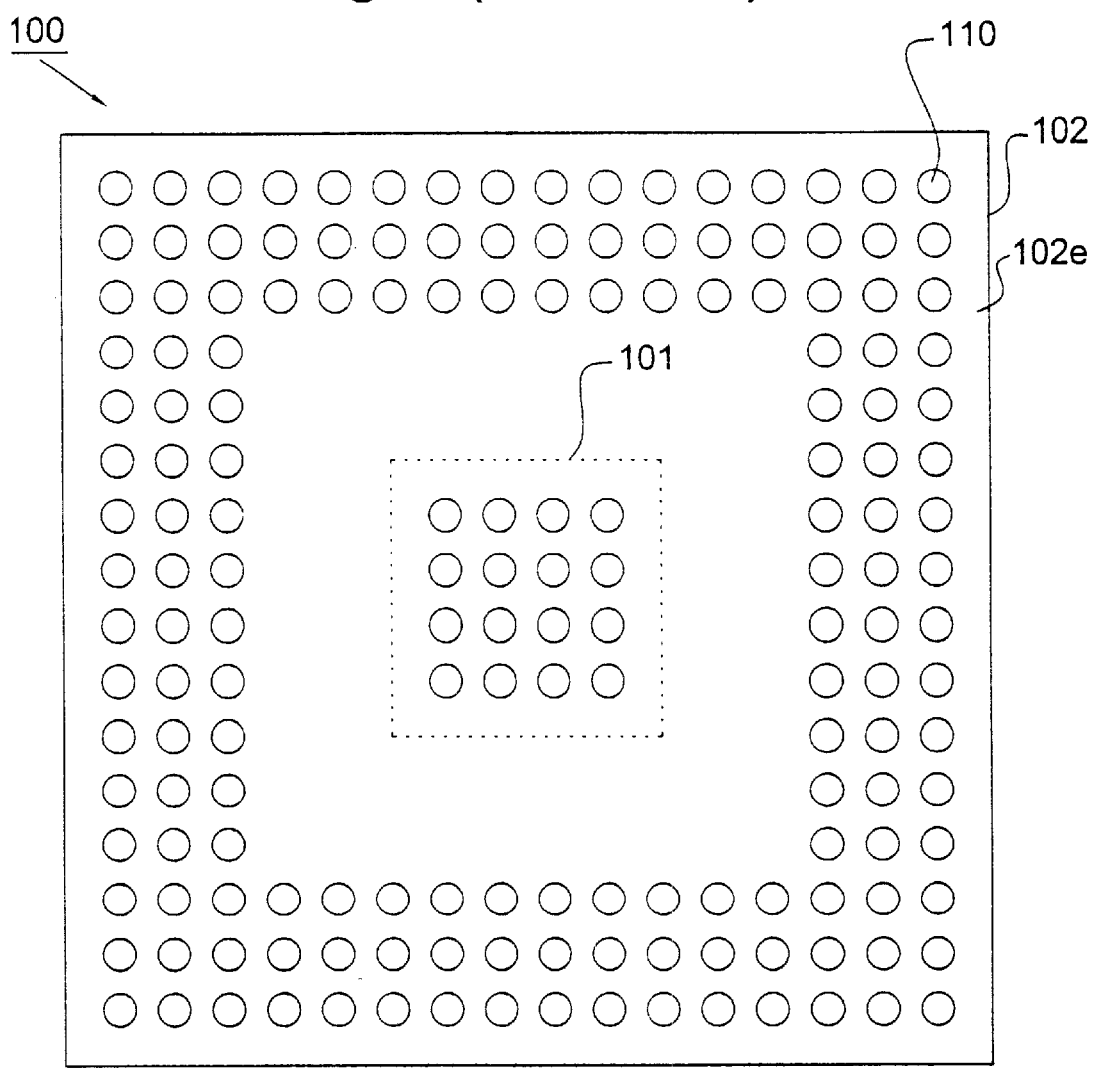
FIG. 2 is a bottom view of the BGA package of FIG. 1.
Figure 3:
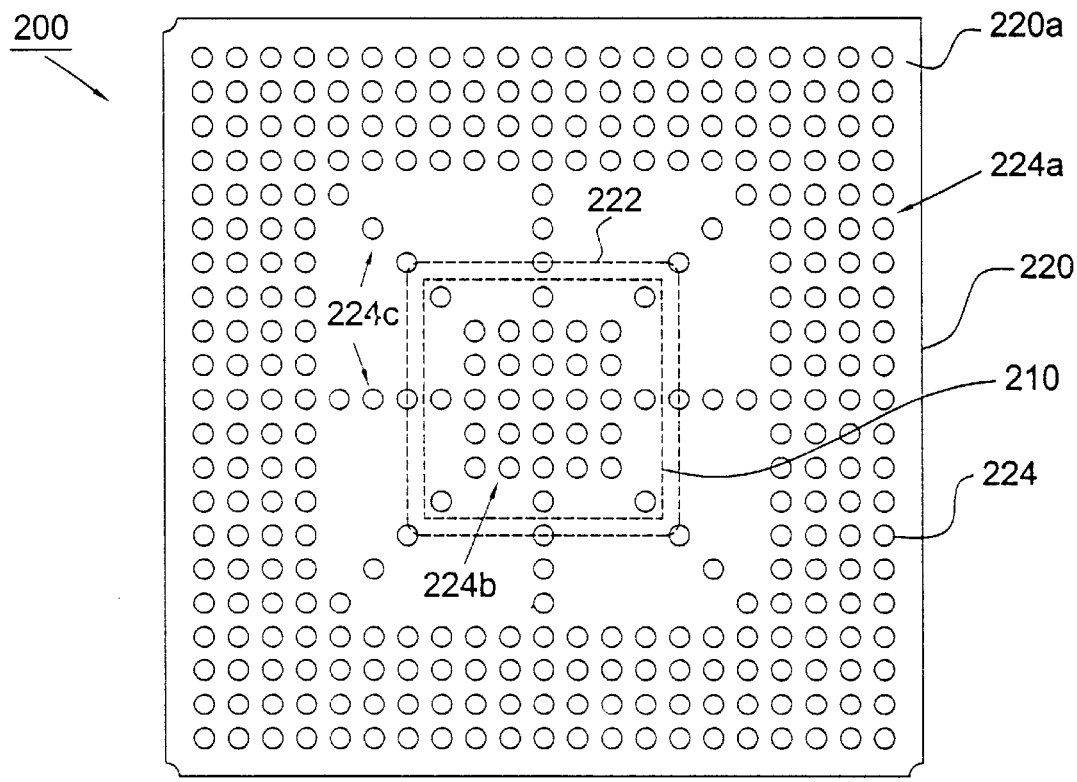
FIG. 3 is a bottom view of a BGA package in accordance with a first preferred embodiment of the present invention.

FIG. 3 is a bottom view of a ball grid array (BGA) package 200 in accordance with a first preferred embodiment of the present invention. The package 200 comprises a chip 210 attached on a substrate 220 having a lower surface 220a and an opposing upper surface. The substrate 220 has a round ring 222 and a plurality of fingers (not shown) on the upper surface thereof. The substrate 220 may also have a power ring (not shown) set outside of the ground ring. Typically, the chip 210 is attached to the upper surface of the substrate 220 and electrically connected to the ground ring 222, the power ring and the fingers through bonding wires (not shown). A package body (not shown) is provided to encapsulate the chip 210, bonding wires and a portion of the upper surface of the substrate 220 so as to protect them against moisture and/or contamination from outside.

Referring to FIG. 3, the lower surface 220a of the substrate 220 of the present invention comprises a plurality of contact pads 224. Typically, BGA package 200 have a plurality of solder balls (not shown) attached to the contact pads 224 on the lower surface of the substrate 220. The solder balls are reflowed to attach the package to a mounting board (not shown). It is noted that the contact pads 224 are divided into three groups including an outer array 224a, a center array 224b and a plurality of intermediate pads 224c located between the outer array and the center array wherein all of the intermediate pads are electrically connected to the ground ring 222 for supplying ground potential. Typically, the center array of contact pads 224 are designed to be coupled to ground and/or power pads of the semiconductor chip 210, the outer array of contact pads 224 are designed to be coupled to signal pads of the semiconductor chip 210. As shown in FIG. 3, the intermediate pads 224c in this embodiment are substantially arranged in a broken "*" pattern.

Figure 4:
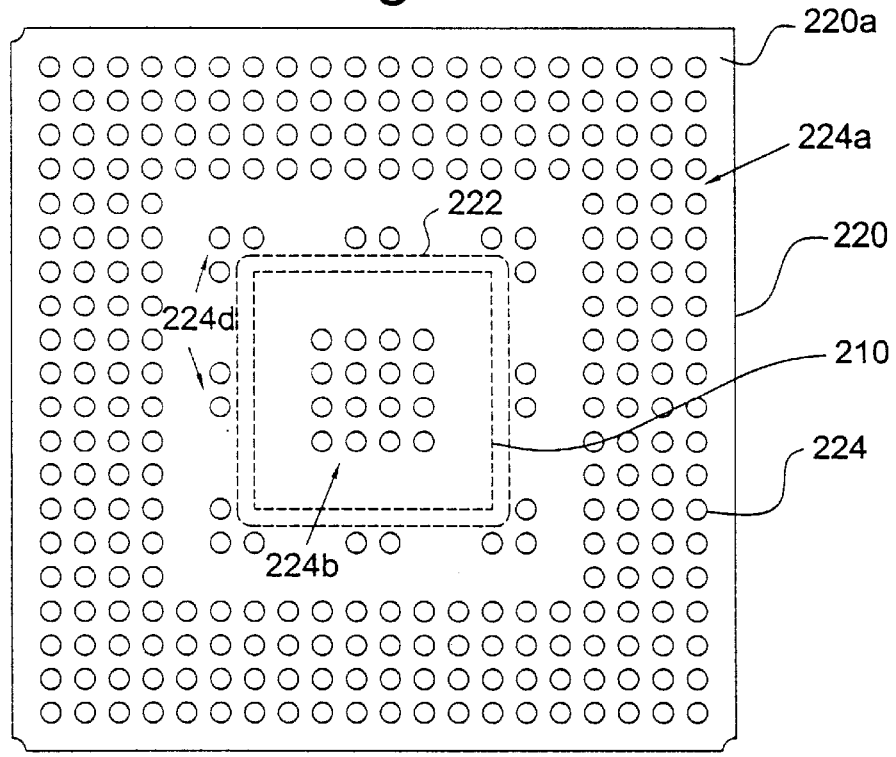
FIG. 4 is a bottom view of a BGA package in accordance with a second preferred embodiment of the present invention.

As shown in FIG. 4, the intermediate pads 224d in the second preferred embodiment of the present invention are divided into several groups substantially arranged in a "*" pattern.

Figure 5:
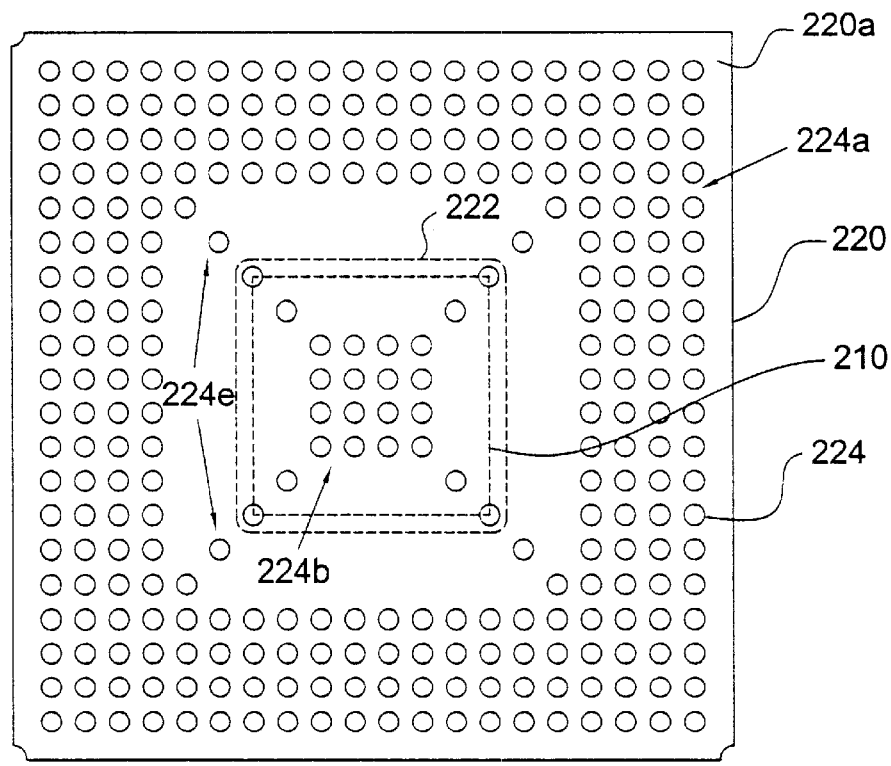
FIG. 5 is a bottom view of a BGA package in accordance with a third preferred embodiment of the present invention.

As shown in FIG. 5, the intermediate pads 224e in the third preferred embodiment of the present invention are substantially diagonally positioned across the lower surface 220a of the substrate 220.

Figure 6:
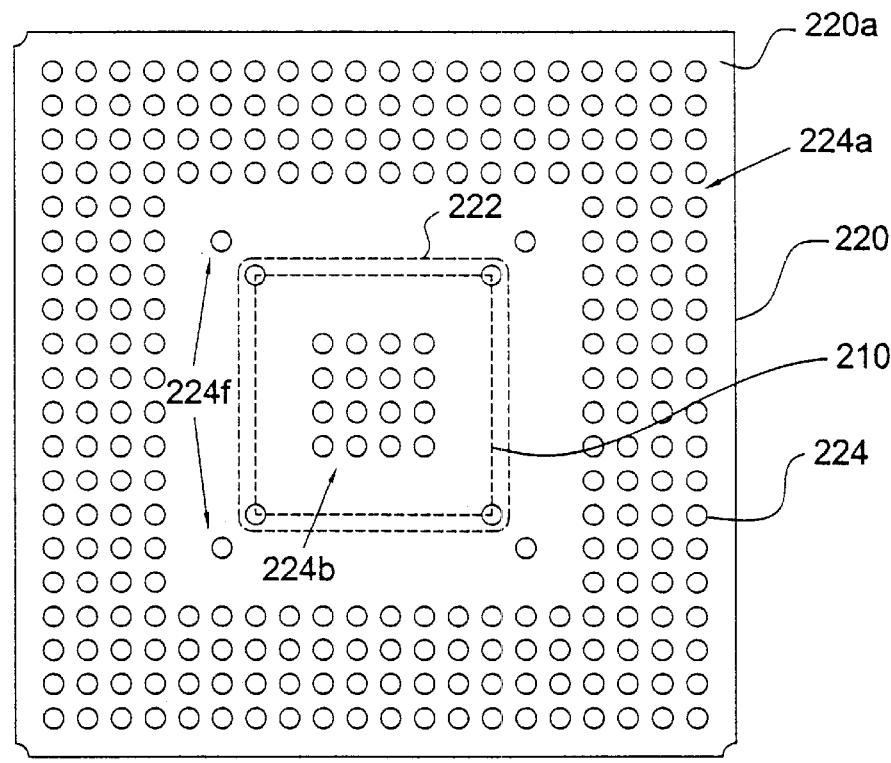
FIG. 6 is a bottom view of a BGA package in accordance with a fourth preferred embodiment of the present invention.

As shown in FIG. 6, the intermediate pads 224f in the fourth preferred embodiment of the present invention are arranged diagonally and positioned away from the outer array 224a of contact pads as well as the center array 224b of contact pads at least a certain distance. Preferably, the distance therebetween is ranged from one to three times of the pad pitch. It could be understood that the pad pitch could be changed for different kinds of chips, depending on the package size.

When the BGA package of the present invention is attached onto a mounting board such as a printed circuit board, stress occurs at the solder joins therebetween as the device experiences temperature changes. The stress is generally maximum at the periphery of the chip 210. Therefore, the solder balls attached to the intermediate pads of the present invention helps to reinforce and stabilize the bonding between the package and the mounting board thereby enhancing the solder joint reliability of other solder balls attached to the outer array and center array of contact pads. Since the intermediate pads of the present invention are designed for grounding, solder failure of some balls attached thereon is not critical. Therefore, the solder balls attached to the intermediate pads helps to absorb stress due to CTE mismatch between the package and the mounting board without sacrificing the reliability of the package.

Although the invention has been explained in relation to its preferred embodiments as described above, it is to be understood that many other possible modifications and variations can be made without departing from the spirit and scope of the invention as hereinafter claimed.

What is claimed is:

1. A substrate for use in packaging of a semiconductor chip, the substrate having opposing upper and lower surfaces, wherein:
   the upper surface of the substrate comprises a ground ring; and
   the lower surface of the substrate comprises an outer array of contact pads, a center array of contact pads and a plurality of intermediate pads located between the outer array of contact pads and the center array of contact pads, wherein all of the intermediate pads are electrically connected to the ground ring.

2. The substrate as claimed in claim 1, wherein the intermediate pads are substantially diagonally positioned across the lower surface of the substrate.

3. The substrate as claimed in claim 2, wherein the intermediate pads are positioned away from the outer array of contact pads as well as the center array of contact pads at least a certain distance.

4. The substrate as claimed in claim 1, wherein the intermediate pads are substantially arranged in a broken "*" pattern.

5. The substrate as claimed in claim 1, wherein the intermediate pads are divided into several groups substantially arranged in a "*" pattern.

6. A ball grid array package, comprising:
   a substrate having opposing upper and lower surfaces, the upper surface of the substrate comprising a ground ring, the lower surface of the substrate comprising an outer array of contact pads, a center array of contact pads and a plurality of intermediate pads located between the outer array of contact pads and the center array of contact pads, wherein all of the intermediate pads are electrically connected to the ground ring;
   a plurality of solder balls attached to the pads of the substrate; and
   a semiconductor chip mounted on the upper surface of the substrate and electrically coupled to the substrate.

7. The package as claimed in claim 6, wherein the intermediate pads are substantially diagonally positioned across the lower surface of the substrate.

8. The package as claimed in claim 7, wherein the intermediate pads are positioned away from the outer array of contact pads as well as the center array of contact pads at least a certain distance.

9. The package as claimed in claim 6, wherein the intermediate pads are substantially arranged in a broken "*" pattern.

10. The package as claimed in claim 6, wherein the intermediate pads are divided into several groups substantially arranged in a "*" pattern.

* * * * *